United States Patent [19]

Lau et al.

[11] Patent Number: 4,856,957
[45] Date of Patent: Aug. 15, 1989

[54] SEMICONDUCTOR WAFER TRANSFER APPARATUS WITH BACK-TO-BACK POSITIONING AND SEPARATION

[75] Inventors: John J. Lau, Dallas; Si-Ming Fang, Plano, both of Tex.

[73] Assignee: Mactronix, Inc., Dallas, Tex.

[21] Appl. No.: 142,439

[22] Filed: Jan. 11, 1988

[51] Int. Cl.⁴ .............................................. B65G 65/00
[52] U.S. Cl. ..................................... 414/404; 414/417
[58] Field of Search ............... 414/403, 404, 405, 417, 414/422, 786, 287

[56] References Cited

U.S. PATENT DOCUMENTS

| | | | |
|---|---|---|---|
| 3,949,891 | 4/1976 | Butler et al. | 414/405 |
| 4,431,361 | 2/1984 | Bayne | 414/405 |
| 4,566,839 | 1/1986 | Butler | 414/417 X |
| 4,566,841 | 1/1986 | Ohmura et al. | 414/417 |
| 4,568,234 | 2/1986 | Lee et al. | 414/417 X |
| 4,573,851 | 3/1986 | Butler | 414/417 X |
| 4,611,966 | 9/1986 | Johnson | 414/417 X |
| 4,695,217 | 9/1987 | Lau | 414/404 |
| 4,744,715 | 5/1988 | Kawabata | 414/417 X |

Primary Examiner—David A. Bucci
Attorney, Agent, or Firm—Ross, Howison, Clapp & Korn

[57] ABSTRACT

An apparatus is disclosed for the bulk transfer of semiconductor wafers from container to container for processing in the back-to-back configuration. The apparatus includes a stage (12) for selectively raising the wafers from a boat (14) upward into a retaining mechanism (18). The wafers are confined in a back-to-back configuration through a slot (64) in the end of a back-to-back retainer (34). The back-to-back configured wafers are then removed, processed and then disposed back in the retaining mechanism (18). The back-to-back wafers are aligned with an alignment slot (76) in a preseparation retainer (36). The preseparation retainer (36) provides both alignment and a slight preseparation with respect to a separation retainer (38). The separation retainer (38) has a separation edge (118) which separates the back-to-back configured wafers into slots (104) and (108). The wafers are then removed after separation thereof.

22 Claims, 3 Drawing Sheets

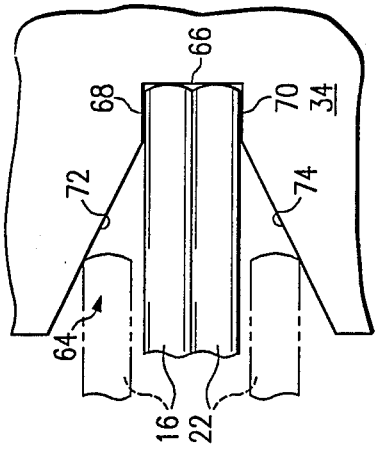
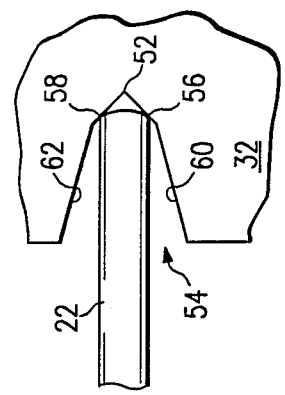
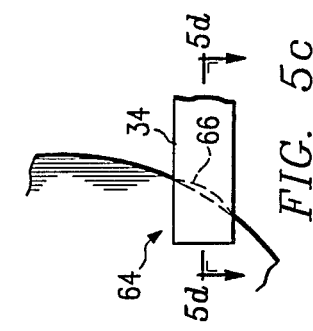
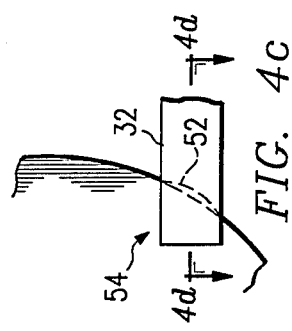
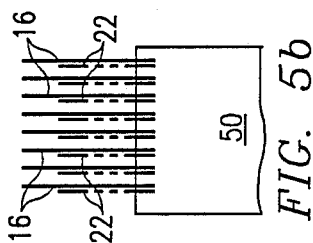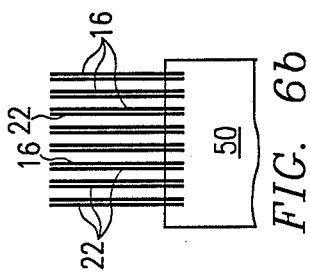
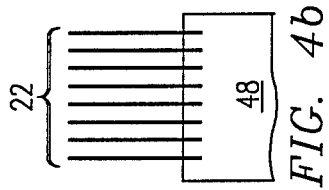
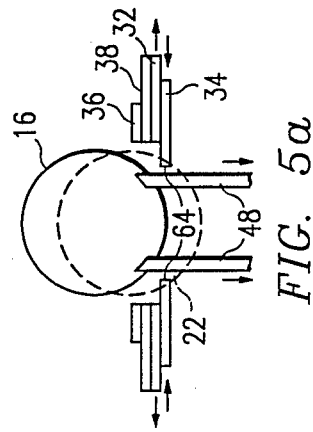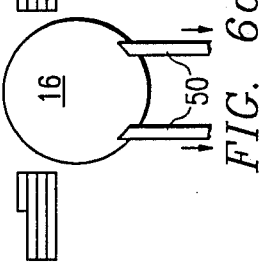
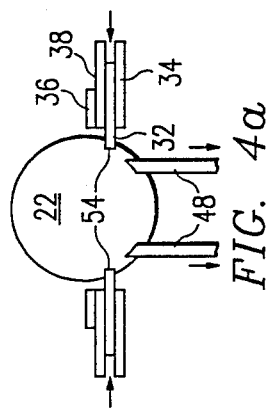

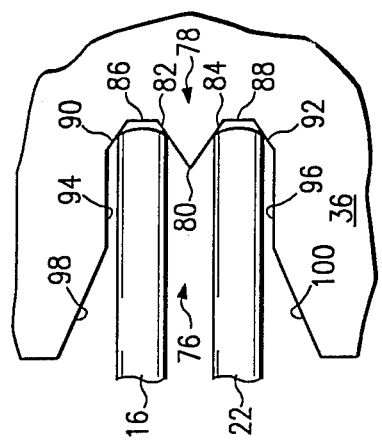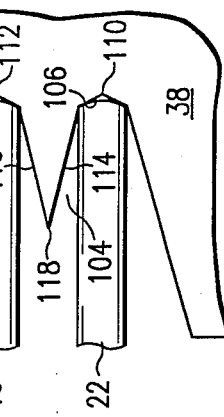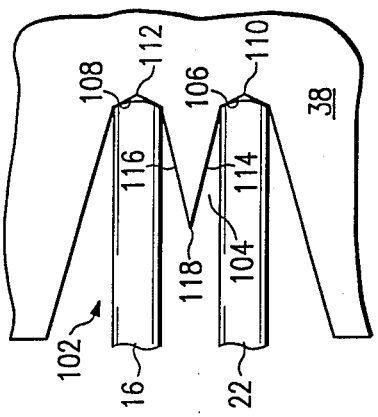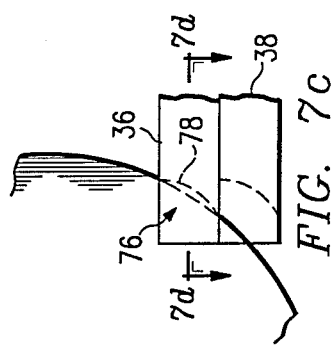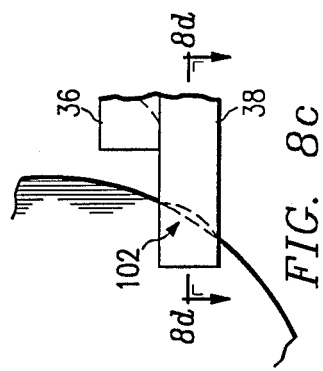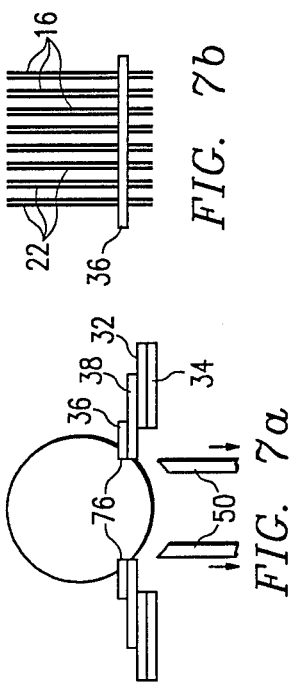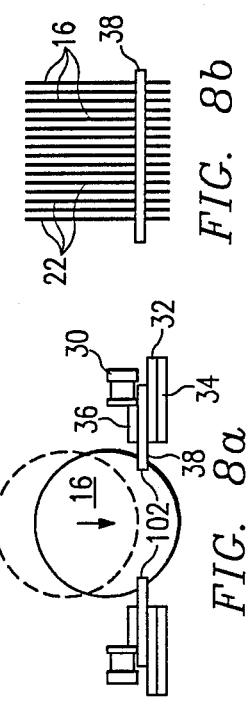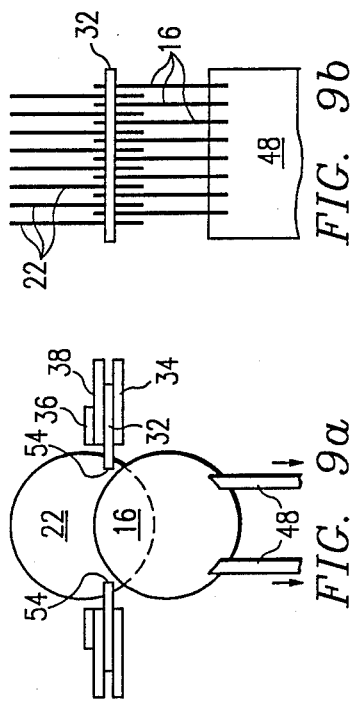

SEMICONDUCTOR WAFER TRANSFER APPARATUS WITH BACK-TO-BACK POSITIONING AND SEPARATION

TECHNICAL FIELD

The present invention pertains in general to wafer handling apparatus, and more particularly, to a wafer handling apparatus that will place two wafers in a back-to-back configuration for subsequent processing and then separate the wafers after processing.

CROSS REFERENCE TO RELATED APPLICATION

This application is related to U.S. Pat. No. 4,695,217, issued Sept. 22, 1987 to John Lau.

BACKGROUND OF THE INVENTION

Wafer handling apparatus are generally utilized to transfer wafers from one transporting vehicle to another. These transporting vehicles are normally referred to as a "boat". In a typical manufacturing environment, there is a moving boat for transporting the wafers between processing stations. At processing stations, the wafers need to be transferred into a quartz boat which is utilized with the actual processing. This is normally carried out with a wafer transfer apparatus which is disclosed in U.S. Pat. No. 4,695,217, issued Sept. 22, 1987, which U.S. Patent is incorporated herein by reference.

One processing technique to increase efficiency is that utilizing a "back-to-back" configuration. In a back-to-back configuration, wafers which are to be processed on only one side are transferred into a quartz boat and then another set of wafers are also transported into the same boat except that the second set of wafers are aligned with the first set of wafers with adjoining wafers having the backs thereof disposed adjacent to each other. With this configuration, it is not necessary to coat or protect the backs, since they are protected from any processing. Therefore, it is important that the wafers are in close proximity to each other.

In a back-to-back configuration, handling is of the utmost importance. When disposing two wafers in close proximity to each other, there is always the possibility of scratching the surface of the wafer. Typically, the wafers have been placed in the boat by hand to insure that the backs of adjoining wafers are closely aligned with each other and, upon separation, a manual operation is also performed, whereby tweezers or some sort of mechanical separator is inserted between the two wafers. This can lead to wobbling of a given wafer and contact with an adjoining set of wafers, which contact would be very undesirable.

There therefore exists a need for a wafer handling apparatus that will both position wafers in a back-to-back configuration and then separate the wafers without incurring any damage to the process surface of the wafer.

BRIEF DESCRIPTION OF THE DRAWINGS

For a more complete understanding of the present invention and the advantages thereof, reference is now made to the following description taken in conjunction with the accompanying Drawings in which:

FIGS. 4a–4c illustrate the initial operation wherein the first set of wafers is removed from the boat and retained in the retainer;

FIGS. 5a–5d illustrate the operation wherein a second set of wafers is intertwined with the first set of wafers and then disposed in a back-to-back configuration;

FIGS. 6a and 6b illustrate the operation wherein the back-to-back configured wafers are removed from the retainer;

FIGS. 7a–7d illustrate the operation wherein the processed back-to-back wafers are removed from the boat and disposed in the holder;

FIGS. 8a–8d illustrate the operation wherein the processed back-to-back wafers are separated; and FIGS. 9a and 9b illustrate the operation wherein one set of the separated wafers is removed from the retainer.

DETAILED DESCRIPTION OF THE INVENTION

Figure 1:
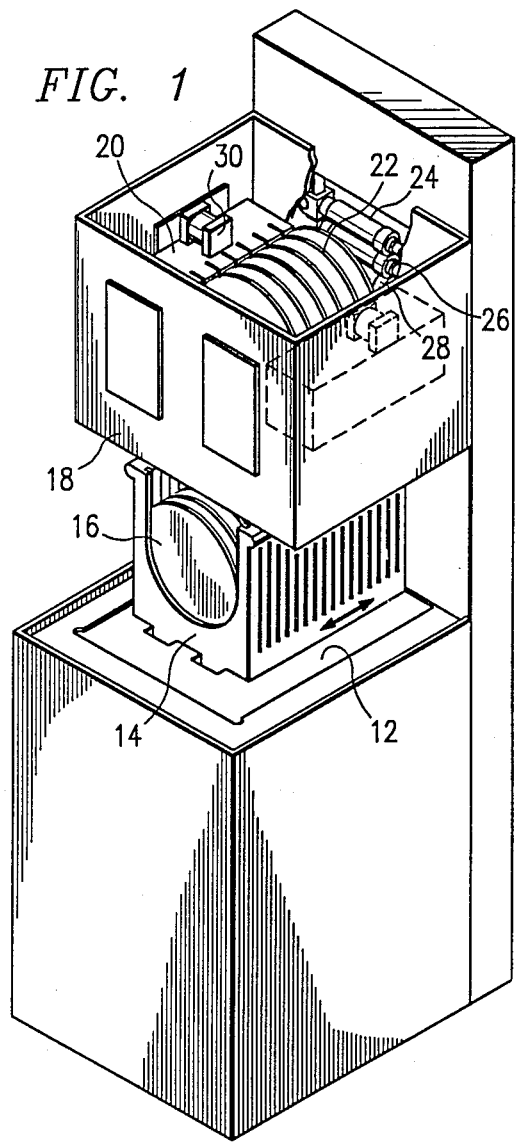
FIG. 1 illustrates a perspective view of the wafer handling apparatus of the present invention.

Referring now to FIG. 1, there is illustrated a perspective view of the wafer handling apparatus of the present invention. This invention relates to U.S. Pat. No. 4,695,217 issued Sept. 22, 1987 to John Lau, which U.S. Patent is incorporated herein by reference. The wafer handling apparatus is generally referred to by the reference numeral 10 and includes a stage 12 which is adapted to receive and support a semiconductor wafer container or "boat" 14, which contains a plurality of semiconductor slices or wafers 16 that are stored on edge in a plurality of vertical storage slots within boat 14. In the current embodiment of the present invention, the stage 12 includes indexing marks for indexing or moving boat 14 forward and backward in the direction indicated by the arrow in FIG. 1. This may be easily accomplished utilizing an air cylinder or any standard electrical technique, such as a solenoid, and is utilized to align wafers 16 under selected storage slots, as will be described in more detail hereinbelow. However, it should also be realized that this alignment can be manually accomplished.

Disposed above stage 12 is a temporary storage or retaining area 18 including a plurality of retainers 20. As will be described hereinbelow, the retainers 20 include four sets of retainers on either side of the wafer 16 which are operable in a variety of manipulations to intertwine two sets of wafers, dispose them back-to-back for processing and then separate the back-to-back wafers after processing. For illustrative purposes, a set of wafers 22 is disposed in the retainer mechanism 18 before being disposed in a back-to-back configuration with the wafers 16.

The retainers 20 are maintained in an outward position with respect to the wafers 22, unless they are in the retaining mode. As will be described hereinbelow, only one set of the retainers is utilized at any one time for the various operations. The retainers are maintained in an outward position by pneumatic air cylinders 24, 26, 28 mounted on the back of retainer 18, and pneumatic air cylinder 30, the operation of which will be described hereinbelow. For illustrative purposes, the logic circuitry for operating the pneumatic air cylinders 24, 26, 28, 30 is not illustrated. It is conventional pneumatic logic with associated pneumatic lines.

In operation, one set of wafers 22 is disposed in an associated boat and inserted on the stage 12 at a given indexed position. This set of wafers is elevated up by the stage 12 by various combs (not shown) and then retained in the retainer mechanism 18. The boat associated with the wafers 22 is then removed and the boat 14 disposed on the stage 12. The boat 14 is indexed such that it is offset with respect to the wafers 22 to allow each of the wafers 16 to be disposed or intertwined between wafers 22. The retainer 18 then is operable to dispose the wafers 16 and 22 in a back-to-back configuration. The wafers are then removed in the back-to-back configuration and then disposed in a quartz boat (not shown) for processing on the outer or exposed surface of the wafers thereof.

After processing of the wafers, the quartz boat is again placed on the stage 12 and the processed back-to-back wafers moved upward into the retainer mechanism 18. The wafers are then separated by the retainer mechanism 18 and the reverse procedure for intertwining wafers is then performed.

Figure 2:
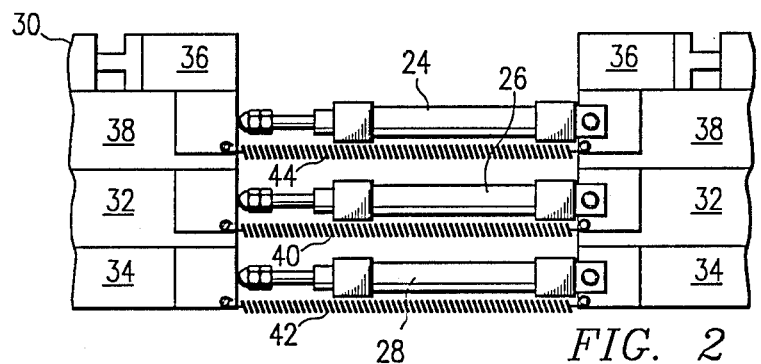
FIG. 2 illustrates a detail of the retainer for holding the wafers.

Referring now to FIG. 2, there is illustrated a detailed side view of the, retainer 20 and associated pneumatic cylinders 24, 26, 28, 30. Like numerals refer to like parts in the various figures. The retainer 20 is comprised of two sets of retaining members on either side of the retainer mechanism 18, which retaining members are operable to hold either side of the wafers 16 or 22. Each of the retaining mechanisms is comprised of an individual wafer retainer 32, a back-to-back combining retainer 34, a preseparator retainer 36, and a separator retainer 38. The individual wafer retainer 32 is operable to hold only the wafers 22 when they are disposed in the retaining mechanism 18. The wafers 16 in the intertwining operation are allowed to move freely through the retainer 32. The retainer 32 normally is pushed outward by the pneumatic cylinder 26, which is associated with the individual wafer retainer 32 and a spring 40 is operable to pull the two sides of the wafer retainer 32 together to hold the wafers 22. The wafers "rest" in the retainer 32 as the retainer contacts two points on the peripheral edge of the wafers that are on opposite sides and below the center of the wafer. This is the first step of the operation.

In the second step of the operation, the back-to-back combining retainer 34, which has the pneumatic cylinder 28 associated therewith, is allowed to move inward through the operation of a spring 42. Although not shown, it should be understood that the individual retainers 32, 36 have a stop associated therewith, which stop limits the inward movement of the retainers. Operation of the associated pneumatic cylinders 24, 26, 28, 30 urges the retainers outward away from the wafers and the associated springs urge the retainers inward to a stop position.

When the back-to-back combining retainer 34 is aligned with the individual retainer 32 with both sets of wafers disposed in the retaining mechanism 18, the wafers are allowed to fall by gravity and be combined by the back-to-back combining retainer 34, the operation of which will be described in more detail hereinbelow.

In order to separate the wafers, the wafers are moved inward to the retainer mechanism 18 and then the preseparator retainer 36 and the separating retainer 38, which operate in conjunction with each other, are controlled by the pneumatic cylinder 24 and an associated spring 44 to move inward to the stop position and the wafers disposed on the preseparator retainer 36. This allows the wafers to be separated by a very small distance, approximately five mils. The preseparating retainer 36 is then moved outward from the wafers by cylinders 30, which are anchored with respect to the separation retainer 38. The separation retainer 38 is then operable to fully separate the wafers. Thereafter, the individual retainer 32 is moved inward and the elevator mechanism 12 moved upward to move the separated wafers from the retainer mechanism 18.

Figure 3:
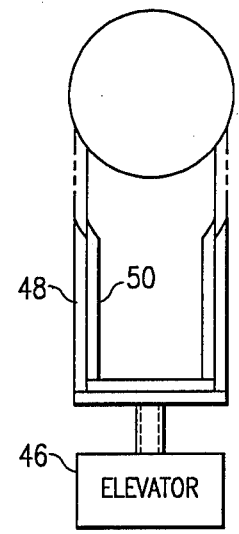
FIG. 3 illustrates a detailed diagram of the double comb operation for lifting the wafers out of the boats.

Referring now to FIG. 3 there is illustrated a crossectional diagram of the elevator mechanism which is operable to move the wafers up from the stage 12. Although not shown in FIG. 1, the elevator mechanism in FIG. 3 is disposed beneath the stage 12 and is operable to move upward through the boat 14 to contact the wafers 16 and push them outward from the boat 14 and upward into the retainer mechanism 18. In the preferred embodiment, the elevator mechanism is a pneumatic system, which is illustrated in U.S. Pat. No. 4,695,217, which is incorporated herein by reference. The operation of the elevator is conventional, as illustrated in U.S. Pat. No. 4,573,851 issued to Butler on Mar. 4, 1986. In the preferred embodiment, there are two sets of "combs" that are reciprocal in an upward direction by an elevator 46. The first comb is represented by a reference numeral 48 and the second comb is represented by a second reference numeral 50. Comb 48 has two parallel faces for alignment parallel with the longitudinal axis of the boat 14 with a plurality of slots along the upper edge of the comb 48 on either side of the associated wafers. The comb 48 is designed to lift individual wafers 16 and 22 upward from the associated boats. Therefore, there are twice as many slots in the upper edge of comb 48 as compared to the number of slots in the boat 14 such that, for example, the wafers 16 rest in every other slot. The remaining slots, on the previous operation, were operable to lift or hold wafers 22 for insertion in the retaining mechanism 18. Therefore, the comb 48 is utilized twice during the loading operation and twice during the unloading operation.

The second comb 50 is similar to the comb 48 and disposed slightly inward therefrom with the exception that the slots on the upper edges thereof are wider and are one half the number to accept the back-to-back configured slices. Therefore, the comb 50 is utilized in the unloading operation of the back-to-back wafers and also in the loading operations of the back-to-back wafers. With the use of two combs, it is not necessary to have overly wide slots in the comb 48, which slots would be designed to handle both the back-to-back configured wafers and the individual wafers. The two combs allow more precise handling of the wafers. In the preferred embodiment, the comb 50 is attached through a sliding mechanism (not shown) to the comb 48 and normally disposed in a position lower than comb 48. A pneumatic cylinder (not shown) is activated when back-to-back wafers are transported such that comb 50 is raised higher than comb 48. The elevator 46 therefore is operable to reciprocate the comb 48 which also reciprocates comb 50.

Referring now to the following figures, the operation of the loading and unloading operation will be described in more detail. FIG. 4a illustrates the movement of the wafer 22 up into the retaining mechanism 18. During the upward motion, all of the retainers 32, 34, 36 are moved outward from the wafer 22 to allow free movement upward into the mechanism 18. After wafers 22 are moved upward, the individual wafer retainer 32 is allowed to move inward by the operation of the spring 40. The wafer 22 is held upward by the comb 48 and the associated elevator mechanism 46 slightly above the contact point of the edge of the wafer 22 with a slot 54 in the edge of the individual wafer retainer 32. The elevator 46 then lowers the comb 48 to allow the edges of the wafer 22 to reside in the associated slots on the edges of the individual wafer retainer 32. It should be appreciated that the edges of the individual wafer retainers 32 contact the edges of the wafer 22 below and on either side of the central axis. The comb 48 is then moved downward beneath the stage 12. FIG. 4b illustrates the disposition of the wafers 22 in the comb 48 during loading thereof.

With reference to FIG. 4c, there is illustrated a side view of the end of the individual wafer retainer 32. This illustrates the slot 54 with a bottom 52 of the slot 54 represented by a phantom line. It can be seen that the phantom line 52 is disposed at an angle with respect to the movement of the comb 48. This angle coincides with the arcuate edge of the wafer 22 and is of a smaller radius. The smaller radius allows the edge of wafer 22 to contact only the ends of the bottom 52.

Referring now to FIG. 4d, there is illustrated a cross-sectional diagram of the end of the wafer retainer 32, illustrating the slot 54 at the point of contact with wafer 22. The slot 54 comes to an apex at the bottom 52 and has two outwardly disposed sides 56 and 58. The sides 56 and 58 join at the apex 52 at an angle of 90°. Thereafter, the side 56 intersects with a side 60 and the side 58 intersects with a side 62. Sides 60 and 62 extend upward at a sharper angle than the sides 56 and 58 with respect to the bottom 52. The angle of sides 56 and 58 allows the wafer 22, which has a round edge, to rest in the center of the slot. The dimensions of this slot 54 position the wafer 22 within the center of the slot, represented by the apex at the bottom 52. Further, the outward flaring of sides 60 and 62 allows a larger or wider wafer to be utilized and allows some "slop".

Referring now to FIG. 5a, the next step in the operation corresponding to loading of the wafer 16 into the retainer mechanism 18 and intertwined with the wafers 22 which were previously loaded in the step illustrated in FIG. 4a. The comb 48 is again utilized to move upward from the bottom of the stage 12 and contact the lower edges of the wafers 16. The wafers 16 are then moved upward into the retaining mechanism 18. The individual wafer retainer 32 has an opening disposed between the wafers 22 that allows the wafers 16 to pass therethrough unimpeded. Therefore, the individual wafer retainer 32 only has a holding member associated with each of the wafers 22 with space provided between each of the holding members. When the wafers 16 are disposed in the retaining mechanism 18, they are intertwined, as illustrated in FIG. 5b.

After the wafers 16 are disposed in the retaining mechanism 18, the back-to-back combining retainer 34 is moved inward through operation of the pneumatic cylinder 28 and spring 42, and then the comb 48 lowered simultaneous with outward reciprocation of the individual wafer retainer 32. This is illustrated in FIG. 5a by a dotted line. Both wafers 16 and 22 move downward into the slot 64 on the edge of the back-to-back combining retainer 34 by gravity and the lowering of the comb 48. In the preferred embodiment, the comb 48 moves downward at the same time that the individual wafer retainer 32 moves outward. This allows both wafers 16 and 22 to move downward into the slot 64 on the end of the back-to-back combining retainer 34.

Referring now to FIG. 5c, there is illustrated the side view of the end of the back-to-back combining retainer 34 illustrating in the slot 54 and FIG. 5d illustrates a cross-sectional view of the slot 64. The slot 64 has a bottom 66 that is disposed at an angle with respect to the movement of the comb 48 such that it approximates the edge contour, and having a smaller radius, of the wafers 16 and 22 when disposed therein.

The cross-sectional shape of the slot 64 illustrates a flat surface of the bottom 66 which has a width that is slightly wider than the combined width of the wafers 16 and 22. The width is selected as a function of the largest or widest wafer that will be handled by the apparatus such that two of such wafers could fit within the slot 64 given normal operating tolerance. The flat surface on the bottom 66 has two perpendicular surfaces extending upward, as noted by reference numerals 68 and 70. The surfaces then flare outward as surfaces 72 and 74 to provide a tapered contour. The tapered contour provided by surfaces 72 and 74 receives the lower edges of the wafers 16 and 22 when they are completely separated and allows them to slide downward into the bottom 66, which is comprised of the flat surface and the two vertical sides 68 and 70. The wafers 16 and 22 are illustrated in phantom lines prior to being combined. Once combined, they are in a back-to-back configuration with the outer edges thereof resting against the bottom 66.

After the wafers 16 and 22 are combined in a back-to-back configuration, the comb 50 is raised upward into the retaining mechanism 18 and the larger slots in the edges thereof contacted with the lower surfaces of the back-to-back configured wafers 16 and 22. They are raised up slightly and the back-to-back combining retainer 34 reciprocated outward. The comb 50 then lowers the back-to-back configured wafers 16 and 20 downward into a quartz boat for processing. The back-to-back configuration is illustrated in FIG. 6b.

After processing, the quartz boat with the back-to-back processed wafers is then inserted into the stage 12 and indexed with respect thereto. The comb 50 then raises the back-to-back configured wafers upward into the retaining mechanism 18 and above a predetermined position with respect to the upper surface of the preseparator retainer 36. Both the preseparator retainer 36 and the separator retainer 38 are then reciprocated inward, it being understood that the two operate in conjunction with each other for alignment purposes, as will be described hereinbelow. The comb 50 is then lowered and the edges of the combined wafers 16 and 22 fall into a slot 76 on the ends of the preseparator retainer 36. This is illustrated in FIG. 7b.

Referring now to FIG. 7c, there is illustrated a cross-sectional diagram of the tip of the preseparator retainer 36 in relationship to the separator retainer 38 with the slot 76 illustrated as having a bottom portion 78. FIG. 7d illustrates a cross-sectional diagram of the slot 76. The bottom portion 78 of the slot 76 has a knife edge with an apex 80 that has two outwardly tapering sides 82 and 84. Sides 82 and 84 intersect with bottom portions 86 and 88 which are perpendicular to the wafers 16 and 22. Bottom portions 86 and 88 intersect with upwardly tapering portions 90 and 92 and, respectively, surfaces 90 and 92 intersect with vertical surfaces 94 and 96. The width between the surfaces 94 and 96 is slightly wider than the combined thickness of the maximum size wafers to be handled by the apparatus in addition to a preseparation width of approximately five mils. The apex 80 of the knife edge on the bottom 78 is operable to be interposed between the wafers 16 and 22 and provide the preseparation. It should be appreciated that the maximum width between surfaces 94 and 96 is less than the distance between the wafers 16 and 22 when originally inserted in the retainer mechanism 18 by the comb 48.

The vertical surfaces 94 and 96 intersect with outwardly tapering surfaces 98 and 100. The surfaces 98 and 100 are operable to direct the edges of the combined wafers 16 and 22 into the bottom portion 78 of slot 76. This provides some prealignment to tolerate some "slop" from the original alignment of the comb 50 and the indexing on stage 12.

After preseparation, the pneumatic cylinders 30 are activated to reciprocate the preseparation retainer 36 outward from the edge of the preseparated wafers 16 and 22. The wafers are then allowed to fall by gravity into slots 102 on the end of the separation retainer 38. This is illustrated in FIGS. 8a and 8b.

Referring further to FIGS. 8c and 8d, there is illustrated a side view of the end of the separation retainer 38 and a cross-sectional diagram of the slot 102. The slot 102 is comprised of two slots 104 and 106, which have a bottom contour identical to slot 54 on the end of the individual wafer retainer 32. The bottom portions of slots 104 and 106 have apexes 110 and 112, respectively, which correspond to the apex 52. The apexes 110 and 112 are separated by a distance equal to the initial separation in the step illustrated in FIG. 5b. The slots 104 and 108 have upwardly tapering edges 114 and 116, respectively, which correspond to the edge 60 in FIG. 4d. The opposite edges of edges 114 and 116 in slots 104 and 106, respectively, have an angle that is much less than 45° relative to the plane of the wafer. These edges 114 and 116 intersect at an apex 118, which edge 118 forms a knife edge. The bottom surfaces of the slots 104 and 106 are each comprised of two surfaces intersecting at the respective apex 110 or 112 and with the respective outward tapering surfaces. The two surfaces on the bottom of the slots 104 and 106 are disposed at an angle of approximately 45°. This knife edge or apex 118 is operable to be inserted between the wafers 16 and 22 and provide full separation. It should be understood that the wafers 16 and 22 were preseparated and aligned with respect to the apex 118. For example, if the preseparation retainer were not utilized, it would be necessary to have the comb 50 align the junction between the backs of the two wafers 16 and 22 with the apex 118. If they were not precisely aligned, there is a possibility that both wafers would enter either slot 104 or slot 108. This is due to the fact that the tapered edge 114 and the tapered edge 116 must direct the separated wafers 16 and 22 away from the apex 118 to apexes 110 and 112, respectively. Utilizing the preseparation retainer 36, the combined wafers can be guided to a predetermined position and then slightly preseparated. By guiding wafers to this predetermined position before full separation, they are more precisely aligned with respect to the knife edge 118. It should be understood that it is possible to utilize the preseparation retainer 36 as only an alignment retainer, such that the junction between the two wafers 16 and 22 in the back-to-back configuration is aligned precisely with respect to the apex 118. Since the preseparation retainer 36 and the separation retainer 28 are in close proximity to one another, it is possible to precisely align the two with respect to each other; that is, movement of the preseparation retainer 36 with respect to the separation retainer 38 can be precisely controlled. This is to be compared with the alignment of the comb 50 with the preseparation retainer 38. Since the comb 50 must move a large distance, it would be very difficult to have precise alignment between the slots in the end thereof and the slots 102 in the end of the preseparation retainer 38. Therefore, the preseparation retainer 36 provides a very important alignment function.

Referring now to FIGS. 9a and 9b, the last step in the operation is described. As illustrated in FIG. 9a, the comb 48 moves upward to contact all of the wafers 16 and 22 since they are now aligned with the slots in the end of the comb 48. The separation retainer 38 is moved inward and the individual wafer retainer 32 is moved outward. The comb 48 then moves downward with the result that the edges of the wafers 22 are captured by the slots 54 in the ends of the individual wafer retainer 32. As described above, there is a space between the slots 54 associated with the edges of the wafers 22 that allows the edges of the wafers 16 to freely move therethrough. The wafers 16 are again placed in the boat 14 and then removed and a second boat associated with wafers 22 indexed to the stage 12. The comb 48 is then again reciprocated upward to raise the wafers 22 slightly above the slots 54 in the individual wafer retainer 32 and then the individual retainer 32 reciprocated outward from the edge of the wafer 22. The comb 48 then reciprocates downward and loads the wafers 22 into an associated boat.

In summary, there has been provided a method and apparatus for handling semiconductor wafers in a back-to-back processing configuration. The method includes first disposing one set of wafers in a retaining apparatus and then intertwining a second set of wafers therewith. The wafers are allowed to fall into a groove by gravity and gently come together in a back-to-back configuration. The back-to-back configured wafers are then removed from the retaining apparatus. After processing, the back-to-back wafers are again placed in the retaining apparatus and aligned with respect to a predetermined separation knife edge. They are slightly preseparated at this point and then allowed to fall via gravity on a separation knife edge which intersects the junction between the two back-to-back configured wafers which provides separation by gravity. The wafers with this gravity separation gently fall into grooves that align them with their original separation. One set of wafers is then removed followed by removal of the second set of wafers.

Although the preferred embodiment has been described in detail, it should be understood that various changes, substitutions and alterations can be made therein without departing from the spirit and scope of the invention as defined by the appended claims.

What is claimed is:

1. A wafer handling apparatus, comprising:
   a first boat for containing pairs of first and second wafers in a back-to-back configuration, each pair of back-to-back wafers contained in an upright and vertical position;
   elevator means for raising the back-to-back configured wafers out of said first boat to a predetermined height;
   alignment means for contacting the edges of said back-to-back wafers and positioning a point between the backs of each pair of the back-to-back wafers over a predetermined alignment point along the peripheral edge thereof;

first and second separation edges operable to be disposed on diametrically opposite sides of said back-to-back wafers at said predetermined alignment point and equi-distant and below a center of the back-to-back wafers at a distance less than a diameter of the wafers;

first and second retainer means associated with each of said first and second separation edges and disposed below said first and second separation edges and a predetermined distance apart to receive and hold peripheral edges of the first and second wafers when separated;

guiding means for guiding the first and second wafers away from said first and second separation edges to said associated first and second retainer means by gravity; and said alignment means operable to be controlled to align the back-to-back wafers above said predetermined alignment point and then allow said back-to-back wafers to fall by gravity onto said separation edges and be separated, said elevator means operable to remove the separated first and second wafers from said first and second retainer means and lower them into a second boat.

2. A wafer handling apparatus, comprising:

a first boat for containing pairs of first and second wafers in a back-to-back configuration, each pair of back-to-back wafers contained in an upright and vertical position;

elevator means for raising the back-to-back configured wafers out of said first boat to a predetermined height;

alignment means for contacting edges of said back-to-back wafers and positioning a point between backs of each pair of the back-to-back wafers over a predetermined alignment point along the peripheral edge thereof;

first and second separation edges operable to be disposed on diametrically opposite sides of said back-to-back wafers at said predetermined alignment point and equi-distant and below a center of the back-to-back wafers at a distance less than a diameter of the wafers;

first and second retainer means associated with each of said first and second separation edges and disposed below said first and second separation edges and a predetermined distance apart to receive and hold the edges of the first and second wafers when separated;

guiding means for guiding the first and second wafers away from said first and second separation edges to said associated first and second retainer means by gravity;

said alignment means operable to be controlled to align the back-to-back wafers above said predetermined alignment point and then allow said back-to-back wafers to fall by gravity onto said separation edges and be separated, said elevator means operable to remove the separated first and second wafers from said first and second retainer means and lower them into a second boat; and back-to-back means for receiving third and fourth wafers spaced apart by said predetermined distance and disposing said third and fourth wafers in a back-to-back configuration such that one face of said third wafer contacts one face of said fourth wafer.

3. The wafer handling apparatus of claim 2 wherein said back-to-back means comprises:

a third boat for containing said third wafers;

a fourth boat for containing said fourth wafers;

said elevator means operable to raise said third wafers in said third boat to a predetermined height;

individual wafer retainer means for retaining said third wafer on peripheral edges thereof at said predetermined height;

said elevator means operable to raise said fourth wafers from said fourth boat to the height of said third wafers and in an alternating relationship therewith, and then to lower said fourth wafers with said individual retainer means operable to release the peripheral edges of said third wafers to lower said third wafers; and back-to-back guiding means for receiving said third and fourth wafers when they are lowered and guiding said third and fourth wafers inwardly toward each other until one face of each of said third and fourth wafers contact each other;

said elevator means and said back-to-back guiding means operable to release said back-to-back configured third and fourth wafers and lower said back-to-back configured third and fourth wafers into said first boat.

4. The wafer handling apparatus of claim 1 wherein said alignment means provides a predetermined amount of preseparation between the first and second wafers above the predetermined alignment point when the back-to-back configured wafers are contacted by said alignment means.

5. A wafer handling apparatus, comprising:

a first boat for containing pairs of first and second wafers in a back-to-back configuration, each pair of back-to-back wafers contained in an upright and vertical position;

elevator means for raising the back-to-back configured wafers out of said first boat to a predetermined height;

first and second reciprocating members disposed on opposite sides of the back-to-back configured wafers and having slots disposed in ends thereof that are operable to contact peripheral edges of the back-to-back configured wafers at a point on either side and beneath a center line of the back-to-back configured wafers, said slots having a bottom surface that conforms to a curvature of the back-to-back configured wafers, and a cross-sectional profile that extends on two sides vertically upwards from the bottom to an outwardly tapering surface, the outwardly tapering surfaces functioning to guide the peripheral edges of the back-to-back configured wafers inward to the bottom, and the vertical surfaces functioning to maintain outward surfaces of the back-to-back configured wafers within a predetermined region such that a junction of the first and second back-to-back configured wafers in the back-to-back configuration is in a confined space, said first and second reciprocating members positioning a point between backs of each pair of the back-to-back wafers over a predetermined alignment point along the peripheral edge thereof;

first and second separation edges operable to be disposed on diametrically opposite sides of said backto-back wafers at said predetermined alignment point and equi-distant and below the center of the back-to-back wafers at a distance less than diameter of the wafers;

first and second retainer means associated with each of said first and second separation edges and disposed below said first and second separation edges and a predetermined distance apart to receive and hold the edges of the first and second wafers when separated;

guiding means for guiding the first and second wafers away from said first and second separation edges to said associated first and second retainer means by gravity;

said first and second reciprocating members operable to be controlled to align the back-to-back wafers above said predetermined alignment point and then allow said back-to-back wafers to fall by gravity onto said separation edges and be separated, said elevator means operable to remove the separated first and second wafers from said first and second retainer means and lower them into a second boat.

6. The wafer handling apparatus of claim 5 and further comprising a preseparation structure disposed at the bottom of said slot, said preseparation structure having an apex disposed in a middle of said bottom with outwardly and downwardly tapering edges.

7. The wafer handling apparatus of claim 1 wherein said first and second retainer means comprises first and second reciprocal members disposed on either side of the back-to-back configured wafers and having slots disposed in ends thereof for contacting the peripheral edges of the back-to-back configured first and second wafers at points on both sides of the back-to-back configured wafers and below the center thereof;

said slots each comprised of two grooves, one groove for being associated with the first wafer and one groove for being associated with the second wafer and spaced apart by said predetermined distance;

each of said grooves having two outwardly tapering surfaces that comprise said guiding means, one outwardly tapering surface of each of said first and second grooves intersecting to provide said first and second separation edges, said first and second separation edges directed toward said alignment points, such that when the back-to-back configured wafers are released from said alignment means, they are allowed to fall by gravity on the intersection of the outwardly tapering walls of said first and second grooves and into said first and second grooves.

8. The wafer handling apparatus of claim 7 wherein said outwardly tapering surfaces of said first and second grooves are disposed at an angle with respect to a plane of said wafers that is much less than 45° and do not intersect at the bottom of said first and second grooves, and the bottom surfaces of said first and second grooves having first and second surfaces intersecting above the bottom of said first and second grooves and extending outwardly and upwardly at an angle of approximately 45° with respect to the plane of the wafers to intersect said outwardly tapering surfaces.

9. A wafer handling apparatus, comprising:

a first boat for holding a plurality of first and second wafers configured as back-to-back wafers in a back-to-back relationship and in an upright and parallel position;

elevator means for contacting lower peripheral edges of said back-to-back wafers and raising them out of said first boat to a first predetermined height;

an alignment retainer having a plurality of alignment slots, each for receiving the peripheral edges of said wafers at a point on either side and below a center of said back-to-back wafers when said back-to-back wafers are at a predetermined height, each of said slots having a bottom surface that corresponds to a contour of the peripheral edges of said alignment wafers, said slots confining said back-to-back wafers about a predetermined alignment point;

a separation retainer having a plurality of separation slots disposed below said alignment slots for separating said back-to-back wafers and retaining separated first and second wafers a predetermined distance apart, said alignment slots having first and second grooves with bottom surfaces corresponding to the contour of said first and second wafers and each of the first and second grooves having outwardly tapered edges, one edge of each of said first and second grooves intersecting to a point to provide a separation edge between said first and second grooves and at said predetermined alignment point and directed toward the center of said back-to-back wafers;

means for reciprocating outward said alignment retainer with respect to said separation retainer such that said back-to-back wafers fall by gravity towards said separation edges and into said first and second grooves; and said elevator means operable to remove said first wafers from said separation retainer means and place said removed first wafers in a second boat for removal therefrom, said elevator means operable to thereafter move said second wafers from said separation retainer and place said removed second wafers in a third boat for removal therefrom.

10. The wafer handling apparatus of claim 9 wherein said alignment slots have vertical surfaces extending upward on either side of the bottom surface thereof to provide two vertical faces for confining said back-to-back configured wafers about said alignment point, said vertical surfaces extending part way from the bottom surface to the peripheral edge of said alignment retainer to intersect with outwardly tapering surfaces, said outwardly tapering surfaces functioning to guide the peripheral edges of said back-to-back wafers toward the bottom surface.

11. The wafer handling apparatus of claim 9 wherein said alignment slots further comprise means for preseparating the back-to-back configured wafers by a predetermined preseparation distance about said alignment point.

12. The wafer handling apparatus of claim 11 wherein said preseparation means comprises two tapered surfaces extending downward in said alignment slots from an apex point to the bottom surface.

13. The wafer handling apparatus of claim 9 wherein said alignment retainer is comprised of two longitudinal members disposed on either side of said back-to-back wafers and parallel with a central axis thereof, each of said longitudinal members having said alignment slots disposed on the peripheral edge thereof nearestmost said back-to-back wafers and operable to be reciprocated inward toward said wafers by said means for reciprocating after said back-to-back wafers are disposed at said predetermined height.

14. The wafer handling apparatus of claim 13 wherein said elevator means is operable to lower said back-to-back wafers into said alignment slots after positioning of said longitudinal members by said means for reciprocating.

15. The wafer handling apparatus of claim 9 wherein each of said grooves has two bottom surfaces disposed at a 45° degree angle with respect to a plane of said first and second wafers and tapering upwardly and outwardly from an intersecting point at the center of the associated first and second grooves, said outwardly tapering surfaces of said first and second grooves disposed at an angle of less than 45° with respect to the surface of said first and second wafers.

16. The wafer handling apparatus of claim 9 and further comprising:
   means for controlling said elevator means to move third wafers from a third boat for disposal at a second predetermined height;
   means for retaining said third wafers at said second predetermined height;
   said elevator means operable to move fourth wafers from a fourth boat and raising said fourth wafers to said predetermined height and spaced by a predetermined distance away from said third wafers in a parallel relationship therewith;
   a combination retainer having a plurality of combining slots, each of said combining slots operable to be positioned at a predetermined point on the peripheral edges of two adjacent ones of said third and fourth wafers at a point on either side and below a center line of said wafers and outwardly combining slots having a bottom surface corresponding to the contour of said third and fourth wafers and outwardly tapering edges extending from the bottom surface thereof and upward to the peripheral edges of said third and fourth wafers;
   means for positioning said combining retainer after said third and fourth wafers are disposed at said predetermined height and lowering said third and fourth wafers into said combining slots; and
   means for moving said back-to-back configured third and fourth wafers from said combining retainer and into said first boat.

17. A method for separating first and second wafers disposed in a back-to-back configuration, comprising:
   disposing the back-to-back configured wafers in an upright and vertical position;
   raising the back-to-back configured wafers to a predetermined height;
   contacting peripheral edges of the back-to-back configured wafers and positioning backs of the back-to-back configured wafers over a predetermined alignment point along the peripheral edge thereof;
   exposing a separation edge on diametrically opposite sides of the back-to-back configured wafers at the predetermined alignment point and equi-distant and below a center of the back-to-back configured wafers at a distance less than a diameter of the wafers;
   lowering the wafers by gravity onto the separation edge and guiding the wafers to a predetermined separation distance;
   lowering the separated first wafers into a separate boat; and
   lowering the second separated wafers into a second boat.

18. The method of claim 17 and further comprising preseparating the wafers by a small distance prior to lowering them onto the separation edge.

19. A method for separating first and second wafers disposed in a back-to-back configuration, comprising:
   disposing the back-to-back configured wafers in an upright and vertical position;
   raising the back-to-back configured wafers to a predetermined height;
   contacting peripheral edges of the back-to-back configured wafers and positioning backs of the back-to-back configured wafers over a predetermined alignment point along the peripheral edge thereof;
   exposing a separation edge on diametrically opposite sides of the back-to-back configured wafers at the predetermined alignment point and equi-distant and below a center of the back-to-back configured wafers at a distance less than diameter of the wafers;
   lowering the wafers by gravity onto the separation edge and guiding the wafers to a predetermined separation distance;
   lowering the separated first wafers into a separate boat;
   lowering the second separated wafers into a second boat;
   raising a third set of wafers to a predetermined height;
   retaining the third set of wafers on the peripheral edges thereof at the predetermined height;
   raising a fourth set of wafers to the height of the third wafers and in an alternating relationship therewith such that each of the third wafers is adjacent one of the fourth wafers;
   lowering the third and fourth sets of wafers;
   guiding the backs of two adjacent ones of the third and fourth sets of wafers together until the backs touch to provide back-to-back configured wafers; and
   lowering the back-to-back configured wafers into the first boat.

20. A wafer handling apparatus, comprising:
   elevator means for disposing first and second sets of wafers at a predetermined height in an adjacent relationship such that each of the wafers in the first set is disposed adjacent one of the wafers in the second set to provide a plurality of pairs of adjacent wafers with backs of adjacent wafers in a pair being disposed a predetermined distance apart;
   a plurality of receiving slots each for being disposed beneath a retaining point on a peripheral edge of an associated one of said adjacent pairs and on either side of and below a central axis of the wafers in a position between the wafers in said associated adjacent pair;
   guiding means for guiding the wafers in each of said adjacent pairs toward each other and downward toward said associated receiving slot to rest therein in a back to-back configuration;
   said elevator means operable to receive said back-to-back configured wafers and lower them from the height of said receiving slots; and
   said elevator means operable to position said first and second sets of wafers at said predetermined height and said receiving slot operable to be disposed beneath said retaining point after positioning thereof by said elevator means and said guiding means operable to guide said adjacent pairs toward said associated receiving slots after said associated receiving slots are disposed beneath said retaining point and then said elevator means operable to raise said back-to-back configured wafers out of said associated receiving slots such that said associated receiving slots can be removed from said retaining point.

21. The wafer handling apparatus of claim 20 wherein each of said receiving slots and said guiding means comprises a tapered slot having a bottom portion corresponding to the peripheral edge of said wafers in the back-to-back configuration and having outwardly tapering sides that are operable to contact the peripheral edges of the wafers at the predetermined distance.

22. The wafer handling apparatus of claim 20 and further comprising means for separating first and second wafers disposed in the back-to-back configuration, said means for separating comprising:
   a first boat for containing the back-to-back wafers in an upright and vertical position;
   said elevator means operable to raise said back-to-back configured wafers out of said first boat to a predetermined height;
   alignment means for contacting the edges of said back-to-back configured wafers and positioning the backs of the back-to-back configured wafers over a predetermined alignment point along the peripheral edge thereof;
   first and second separation edges operable to be disposed on diametrically opposite sides of said back-to-back configured wafers at said predetermined alignment point and equi-distant and below a center of said back-to-back configured wafers at a distance less than a diameter of the back-to-back configured wafers;
   first and second retainer means associated with each of said first and second separation edges and disposed below said first and second separation edges and a predetermined distance apart to receive and hold the edges of the first and second wafers when separated;
   separation guiding means for guiding the first and second wafers away from said first and second separation edges to said associated first and second retainer means by gravity; and
   said alignment means operable to align the back-to-back configured wafers above said predetermined alignment point and then allow said back-to-back configured wafers to fall by gravity onto said separation edges and be separated, said elevator means operable to remove the separated first and second wafers from said first and second retainer means and lower them into a second boat.

* * * * *

UNITED STATES PATENT AND TRADEMARK OFFICE
CERTIFICATE OF CORRECTION

PATENT NO. : 4,856,957
DATED : August 15, 1989
INVENTOR(S) : John J. Lau and Si-Ming Fang It is certified that error appears in the above-identified patent and that said Letters Patent is hereby corrected as shown below:

Column 2, line 5, "4c" should be "4d".

Column 4, lines 11 and 12, "cros-ssectional" should be "cross-sectional".

Column 11, line 29, "comprises" should be "comprise".

Column 13, line 34, delete "and outwardly" and insert therefore -- , said --.

Signed and Sealed this

Eighteenth Day of August, 1992

Attest:

DOUGLAS B. COMER

*Attesting Officer*  *Acting Commissioner of Patents and Trademarks*